United States Patent [19]

Hill et al.

[11] 4,275,350

[45] Jun. 23, 1981

[54] SAMPLE SPINNING MECHANISM FOR NMR PROBES

[75] Inventors: Howard D. W. Hill; Ulrich Huber, both of Cupertino, Calif.

[73] Assignee: Varian Associates, Inc., Palo Alto, Calif.

[21] Appl. No.: 42,821

[22] Filed: May 29, 1979

[51] Int. Cl.$^3$ .......................................... G01N 27/00
[52] U.S. Cl. ................................................... 324/321
[58] Field of Search ................................. 324/321, 318

[56] References Cited

U.S. PATENT DOCUMENTS

| 3,588,677 | 6/1971 | Kleiman | 324/321 |
| 4,088,944 | 5/1978 | Engler | 324/321 |
| 4,201,941 | 5/1980 | Fyfe | 324/321 |

FOREIGN PATENT DOCUMENTS 1205363 9/1970 United Kingdom .

OTHER PUBLICATIONS

Fyfe et al., European Patent Application 9535.

Primary Examiner—Michael J. Tokar
Attorney, Agent, or Firm—Stanley Z. Cole; Leon F. Herbert; Edward H. Berkowitz

[57] ABSTRACT

An air bearing sample spinner for use in an NMR probe has a first air bearing established between frusto-conical mating surfaces of rotor and stator to provide levitation and rotation. A cylindrical portion projects from the rotor into a similar coaxial cylindrical portion of the stator where a journal bearing is provided for centering of the rotor in the stator housing.

4 Claims, 5 Drawing Figures

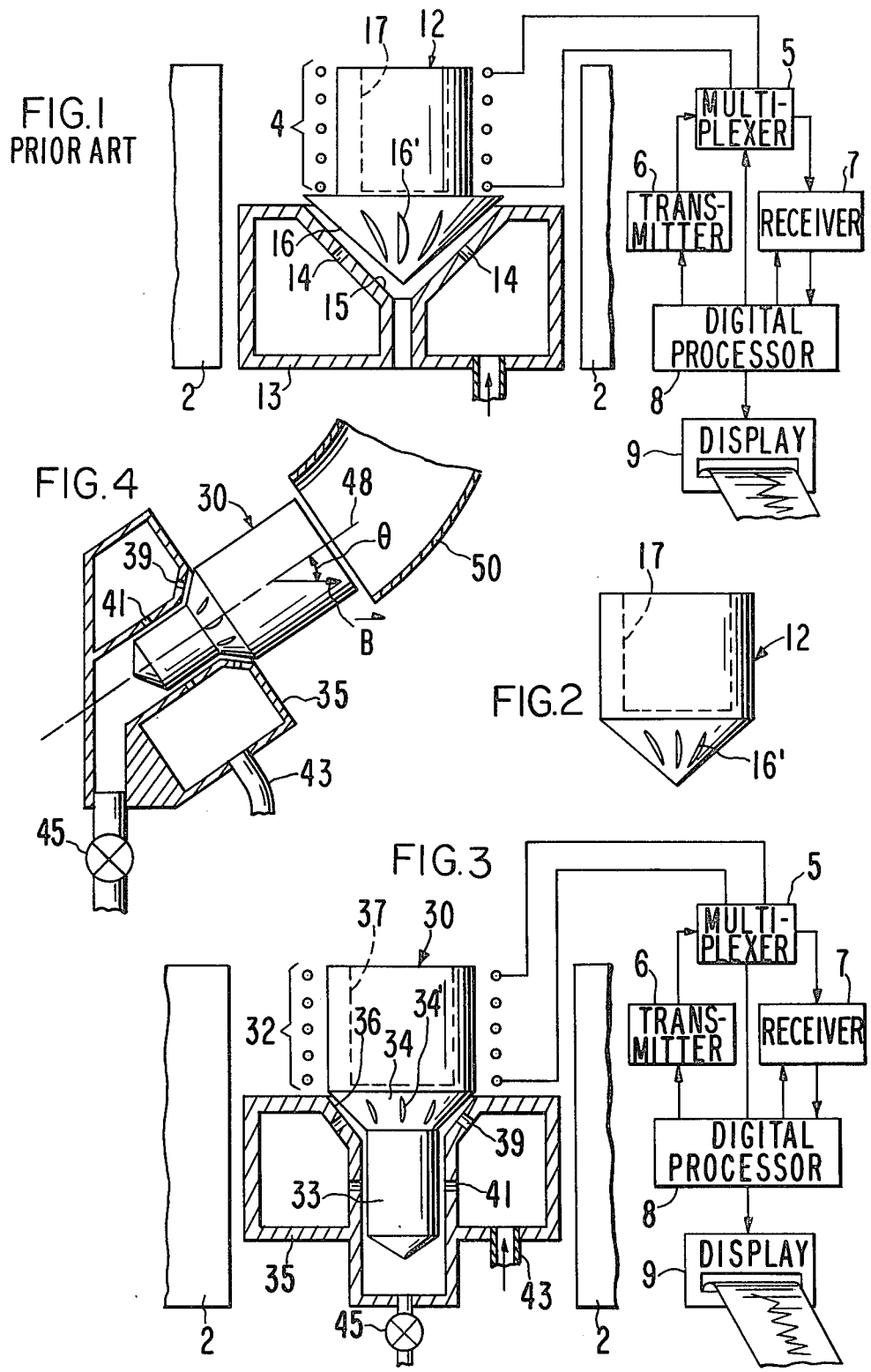

SAMPLE SPINNING MECHANISM FOR NMR PROBES

DESCRIPTION

1. Field of the Invention

This invention relates to air driven turbines for spinning a sample about an axis and especially to the employment of such apparatus in NMR spectrometer systems, particularly for the study of materials in the solid phase.

2. Background of the Invention

In the study of liquid materials by NMR, the resolution is often limited by gradients and inhomogeneities in the magnetic field to which the sample is subject. Due to its finite physical extension, different parts of the sample may be subject to slightly different magnetic field intensity or direction. It has become common practice to spin the sample holder, using a gas driven turbine, thus averaging the inhomogeneities of the field. Samples in the solid phase present a more subtle reason for spinning. Resonance lines are broadened by static dipolar interactions between nuclei. In addition, the "chemical shift" of a nucleus is a function of the orientation of a molecule with respect to the polarizing magnetic field. In a polycrystalline material, where all orientations are present, this orientation dependence results in a line broadening. The thermal motions in liquids and gases average both of these effects so that sharp resonance lines can be observed. The averaging may also be realized for solids by rotating the sample rapidly about an axis inclined at an angle $\theta$ to the polarizing magnetic field. Optimum averaging is achieved when the angle, $\theta$, is chosen to satisfy the condition $1-3\cos^2\theta=0$. This optimum angle is the so-called "magic angle" $\theta_m = 54°44'$. A further condition for averaging is that the rate of rotation should be large compared with the strength of the interaction and, for solid state NMR, this requires rotation rates up to several thousand revolutions per second. Experiments of this type were reported by Lowe (Phys. Rev. Letters 2, 285 (1959)) and by Andrew et al. (Nature 183, 1802 (1959)).

A first representative sample spinning turbine of the prior art employs a rotor with a frusto-conical shape accommodated within a similar frusto-conical stator or housing. The rotor may be machined directly from the sample to be studied or the cylindrical portion of the rotor may be hollowed out to hold the sample and the air issuing from jets in the frusto-conical surfaces of the stator impinge the mating surface of the rotor, levitating the rotor with a thin film of air between the mating surfaces. The bearing surface of the rotor may be provided with indentations orientated to provide rotational motion also in response to the air jet directed against the rotor.

In another example of prior art for spinning liquid samples the stator has a circular internal cross section with a plurality of jets oriented generally tangential to this inner surface in which the rotor is disposed. The rotor is spherical or cylindrical and provided with louvre-like indentations in its lower hemisphere or lower portion to provide rotation from the tangentially directed gas stream. The rotor will also rise under the influence of these air jets to a desired equilibrium height. The distinction in both of these rotors with the rotor above described (of frusto-conical bearing surface) is that only a very narrow annular area is provided for the congruent, air-separated surfaces in contrast to the substantially large area of the frusto-conical shaped surfaces of the first example.

Wobble of the sample spinner about its axis of rotation has been corrected in the prior art by providing a plurality of axial bearing means as described in U.S. Pat. No. 4,088,944, commonly assigned with the present invention.

SUMMARY OF THE INVENTION

It is an object of the present invention to provide an improved sample spinner for an NMR spectrometer.

A further object is to provide an air bearing supported turbine for maintaining alignment of the rotor axis within the stator housing with improved stability.

Another object is to provide an air driven sample spinner for which the rotor axis may be inclined at a variety of angles with respect to the vertical.

These and other objects are accomplished by providing for two separate sets of air bearings for a sample spinning turbine. Frusto-conical mating surfaces of turbine and stator are separated during levitation by a thin film of air provided by jets in the frusto-conical stator surface. A cylindrical portion of the rotor projects from the quasiapical portion of the frusto-conical surface of the rotor and this portion is enclosed in a similar coaxial cylindrical portion of the stator. Jets provided in the cylindrical housing portions serve to maintain centering of the turbine axis. Rotational drive may be provided by either or both sets of bearings.

BRIEF DESCRIPTION OF THE DRAWINGS

FIG. 1 is a schematic illustration of a sample spinner turbine of the prior art.

FIG. 2 is a schematic illustration of another sample spinner turbine of prior art.

FIG. 3 is a schematic illustration of the sample spinning turbine of the present invention.

FIG. 4 is a schematic illustration of sample spinning turbine in an inclined orientation.

DETAILED DESCRIPTION OF THE INVENTION

Figure 4A:
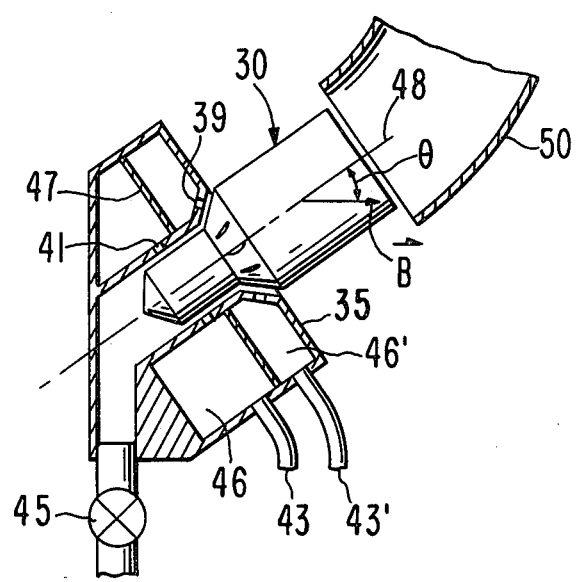
FIG. 4a is a variation of the apparatus of FIG. 4.

A sample spinner is commonly employed in NMR technology for studies of samples in the liquid phase. Because high resolution NMR requires homogeneity in the polarizing magnetic field, rotating the sample tends to average out inhomgeneities in the field.

For studies in the solid phase sample spinning is used to average internal interactions and requires spinning rates much higher than those used for liquid phase studies.

The invention can best be appreciated with reference to a prior art spinner illustrated in FIG. 1 with reference to an NMR spectrometer. A common embodiment of such a spectrometer system is broadly regarded as comprising a magnet for sustaining a polarizing magnetic field in the region between pole pieces 2 wherein the sample spinner 3 is situated. An RF probe, symbolized by a stationary coil 4 is provided for excitation and signal pickup from the sample (not shown). The coil 4 is multiplexed through multiplexer 5 to an RF source such as transmitter 6 or an RF detector such as receiver 7. Control of these entities is accomplished by suitable apparatus such as a digital processor 8. Various outputs may be obtained as, for example, the display or plotted data by the appropriate device 9. Of course, complex modulation and phase sensitive detection apparatus is comprehended in this highly schematicized description. A rotor 12, housed in stator 13 is driven by jets 14 in a surface 15 of the stator which approximately mates with a corresponding surface 16 of the rotor 12. The rotor 12 is adapted to receive a sample by providing a cavity 17 therein. A solid sample or a glass vial containing a liquid sample may be inserted in the cavity 17 or a liquid may be contained in said cavity with appropriate means for closure. It should be appreciated that solid samples may be in powder form compacted within the cavity of the rotor and in other instances the rotor may be machined directly from the sample. The stationary RF coil 4 for irradiating/monitoring the sample is wound to receive the cavity region of the rotor with an appropriate tolerance to accommodate wobble of the rotor axis. Efficiency in coupling the RF field to the sample is promoted by minimizing the separation between the O.D. of the sample and the I.D. of the coil. This is limited by the stability of the rotor axis against a wobble. Rotor stability can be increased by a larger area for the air film generated between the approximately mating surfaces 15 and 16 by jets 14. Scalloped indentations 16' are provided in the surface 16 to provide rotary motion when subject to the air stream from jets 14. The rotor of FIG. 1 embodies a shoulder 18 which extends the surface area in such a fashion. As a consequence, the rotor cannot be removed from the apparatus without also removing the RF coil 4.

Elimination of the shoulder as in FIG. 2 permits closer coupling of the RF coil 4 to the sample in cavity 17 and further permits the rotor/sample to be ejected pneumatically as described in U.S. Pat. Nos. 3,618,683 and 3,512,078, both commonly assigned with the present application. However, such a rotor exhibits a greater tendency to instability against wobble.

With the aid of FIG. 3 the rotor 30 of the present invention may be described as having a cylindrical portion 32, of first radius, and a coaxial cylindrical portion 33 of smaller radius with a taper or frusto-conical surface 34 between these two portions. A housing or stator 35 has a concave frusto-conical surface 36 surrounding the tapered surface 34 of the rotor. In a preferred embodiment these surfaces are not precisely congruent, but instead provide for a narrowing annular region for the escape of air at the circumference of the rotor. A sample mounting cavity 37 is provided as before. Jets 39 are again provided to levitate the rotor by gas flow through jets 39 and to rotate the rotor by the force exerted on the scalloped impelling surfaces 34' due to the gas flow. A separate plurality of jets 41 are symmetrically disposed about the cylindrical portion 33 of the rotor. These jets provide a symmetrical distributed substantially radially inwardly directed gas flow against cylindrical portion 33 thereby stabilizing the rotor 30 against wobbles and displacement of the rotor axis from the stator axis.

Gas is supplied to jets 39 and 41 through inlet 43 from a source not shown. It will be observed that additional scalloped impelling surfaces could be constructed on the surface of cylindrical portion 33 to realize additional rotational advantage from centering jets 41.

A valve 45 is provided to control outflow of gas from the bottom of the housing 35. When momentarily closed the gas pressure is relieved by ejection of the rotor from the apparatus as is further described in U.S. Pat. Nos. 3,618,683 and 3,512,078. The design of the present invention improves the ejection feature because the pressure relief is effected more uniformly and the rotor structure is constrained to the direction of ejection. Alternatively, valve 45 may allow high pressure gas to be fed to the bottom of housing 35 to provide additional force for ejecting the sample.

For convenience FIG. 3 has shown the rotational axis perpendicular to magnetic pole pieces. The present invention is especially important in the geometry shown in FIG. 4. The axis of rotation 48 of rotor 12 is shown inclined at the "magic angle", $\theta_m$, with respect to magnetic field B provided by pole pieces or superconducting solenoid not shown. The exigencies of magnet structures ordinarily result in a generally horizontal or vertical alignment of the field B with result that the rotational axis alignment is inclined with respect to the vertical. It will be apparent that in this inclination the centering jets 41 are essential to preserve the desired axial alignment against the effects of gravity. Closure of the valve 45 provides a pressure increase from the lateral bearing exhaust gases propelling the rotor through the sample eject tube 50.

It will also be noted, following FIG. 4a, that separate pressurized gas inlets are optionally provided through division of stator housing 35 into two regions 46 and 46'. A second pressurized gas inlet 43' permits different pressures to be maintained at the radial jets 41 and rotating/levitating jets 39.

While there has been shown and described one specific embodiment of the invention, it will be clear that variations in the details of the embodiment illustrated and described may be made without departing from the true spirit and scope of the invention as defined in the appended claims:

We claim:

1. An NMR spectrometer for analysis of a sample comprising polarizing magnetic field means for impressing precessive motion upon sample quantum systems, RF probe means for excitation of resonance in said precessive motion in combination with an RF source means and said probe means for detection of said resonance in combination with RF detection means and sample spinner means for rotating said sample in said magnetic field, the improvement comprising an air bearing supported turbine for spinning a sample at high rotational frequencies in a volume region of controlled magnetic field, said turbine comprising a rotor and a stator for housing said rotor, the improvement wherein said rotor comprises a portion of a frusto-conical shaped member located intermediate a first cylindrical portion of first diameter and a second cylindrical portion of smaller diameter than said first diameter, a stator for housing said rotor, said stator having a tapered portion for receiving said frusto-conical rotor portion and a cylindrical portion for receiving said second cylindrical portion, a first set of jets in said tapered portion of said stator for levitating said rotor, a second set of jets in said cylindrical portion of said stator for maintaining alignment of said rotor axis with the axis of said cylindrical portion of said stator, and said rotor further comprising means for deriving rotational motion from at least one of said set of jets.

2. The spectrometer of claim 1 wherein the taper of said tapered portion of said rotor defines a first cone semi-angle with said stator axis and said frusto-conical surfaces form a second cone semi-angle with said rotor axis, said first semi-angle more acute than said second semi-angle, whereby the air stream exiting at the periphery of said rotor is restricted in flow.

3. In a method for spinning a rotor about an axis inclined with respect to the vertical axis, the step of
   radially impinging a portion of said rotor with a first pressurized gaseous stream,
   radially impinging another portion of said rotor with at least a second gaseous stream to oppose the force of said first gaseous stream whereby the orientation of said rotor axis is maintained in a desired direction and,
   tangentially impinging said rotor with another gaseous stream having a component in said vertical axis direction to cause levitation of said rotor in response to said vertical component and rotation in response to said tangential component.

4. In apparatus for spinning a sample in an NMR spectrometer, said sample adapted for spinning about an axis oriented at an angle with respect to the vertical, comprising:
   a rotor structure comprising a portion of a frusto-conical shaped member located intermediate a first cylindrical portion of first diameter and a second cylindrical portion of smaller diameter than said first diameter,
   a stator for housing said rotor, said stator having a tapered portion for receiving said frusto-conical rotor portion and a cylindrical portion for receiving said second cylindrical portion,
   a first set of jets in said tapered portion of said stator for levitating said rotor,
   a second set of jets in said cylindrical portion of said stator for maintaining alignment of said rotor axis with the axis of said cylindrical portion of said stator, said rotor further comprising means for deriving rotational motion from at least one of said set of jets,
   tubular guide means having an entrance spaced from said stator by an amount sufficient for clearance of said guide means from said rotor during the rotation of said rotor and said guide means aligned with said stator to receive said rotor upon expulsion from said stator, said second cylindrical section of said rotor of sufficient length to remain laterally surrounded by a portion of the corresponding portion of the stator while the first cylindrical portion of said rotor has entered said guide means during expulsion, and
   means for expelling said rotor from said stator.

\* \* \* \* \*